(12) United States Patent
Weiss et al.

(10) Patent No.: US 11,748,869 B1
(45) Date of Patent: Sep. 5, 2023

(54) IMAGE-BASED OVERLAY TARGETS INCORPORATING FEATURES FOR PATTERN RECOGNITION AND MOIRE FRINGE PATTERNS FOR MEASUREMENT

(71) Applicant: Intel Corporation, Santa Clara, CA (US)

(72) Inventors: Martin Weiss, Portland, OR (US); Apratim Dhar, Portland, OR (US); Aaron M. White, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 910 days.

(21) Appl. No.: 16/504,695

(22) Filed: Jul. 8, 2019

(51) Int. Cl.
| | |
|---|---|
| *G06T 7/00* | (2017.01) |
| *G06T 7/73* | (2017.01) |
| *G06V 10/75* | (2022.01) |
| *H01L 23/498* | (2006.01) |
| *H01L 23/544* | (2006.01) |
| *G03F 1/44* | (2012.01) |
| *G03F 1/42* | (2012.01) |

(52) U.S. Cl.
CPC ............... *G06T 7/001* (2013.01); *G03F 1/42* (2013.01); *G03F 1/44* (2013.01); *G06T 7/74* (2017.01); *G06V 10/751* (2022.01); *H01L 23/49838* (2013.01); *H01L 23/544* (2013.01); *G06T 2207/30148* (2013.01); *H01L 2223/54426* (2013.01)

(58) Field of Classification Search
CPC . G06T 7/001; G06T 7/74; G06T 2207/30148; G03F 1/42; G03F 1/44; G06V 10/751; H01L 23/49838; H01L 23/544; H01L 2223/54426

See application file for complete search history.

(56) References Cited

U.S. PATENT DOCUMENTS

| | | | |
|---|---|---|---|
| 7,349,105 B2 | 3/2008 | Weiss | |
| 2002/0158193 A1* | 10/2002 | Sezginer | ................. H01L 22/34 250/237 G |
| 2004/0002011 A1* | 1/2004 | Laughery | ............. H01L 23/544 430/311 |
| 2006/0044568 A1* | 3/2006 | Weiss | ................. G03F 7/70633 356/509 |

(Continued)

FOREIGN PATENT DOCUMENTS

WO  WO-2017111925  6/2017

*Primary Examiner* — Sang H Nguyen
(74) *Attorney, Agent, or Firm* — Schwabe, Williamson & Wyatt, P.C.

(57) ABSTRACT

Embodiments disclosed herein include a lithography reticle set and methods of using such reticle sets. In an embodiment, the set comprises a first reticle and a second reticle. In an embodiment, the first reticle comprises a first grating having a first pitch, and a second grating having a second pitch. In an embodiment, the second reticle comprises a third grating having a third pitch, wherein the third pitch is different than the first pitch, and a fourth grating having a fourth pitch, wherein the fourth pitch is different than the first pitch. In an embodiment the third grating overlaps the first grating and the fourth grating overlaps the second grating when two or more edges of the first reticle are aligned with two or more edges of the second reticle. In an embodiment the first reticle or the second reticle further comprises a pattern recognition feature.

13 Claims, 12 Drawing Sheets

(56) References Cited

U.S. PATENT DOCUMENTS

| | | | |
|---|---|---|---|
| 2007/0081170 A1* | 4/2007 | Sezginer | H01L 23/544 |
| | | | 257/E23.179 |
| 2014/0199618 A1* | 7/2014 | Mieher | G03F 1/20 |
| | | | 430/30 |
| 2015/0377614 A1* | 12/2015 | Sato | G03F 7/0002 |
| | | | 425/150 |
| 2019/0219930 A1* | 7/2019 | Yang | G03F 9/7084 |

* cited by examiner

US 11,748,869 B1

IMAGE-BASED OVERLAY TARGETS INCORPORATING FEATURES FOR PATTERN RECOGNITION AND MOIRE FRINGE PATTERNS FOR MEASUREMENT

TECHNICAL FIELD

Embodiments of the disclosure are in the field of semiconductor structures and processing and, in particular, to overlay targets that include pattern recognition features and moiré fringe patterns.

BACKGROUND

Integrated circuits (ICs) are becoming smaller and more powerful. As ICs become smaller, the location and alignment of features on the ICs becomes more critical. Features, such as transistors, vias, and the like, are created on semiconductor substrates using photolithography processes. Photolithography uses optics to define features on the substrate. A feature may be drawn on a reticle, or mask, and light is shown through the mask so as to project the feature onto a layer of photoresist on the substrate. Photoresist is a light sensitive film that either becomes soluble or insoluble when exposed to light. After the layer of photoresist has been exposed to light, the soluble portion can be removed, typically by immersion in a developer solution. Other processing techniques, such as etching or annealing, may be performed to the underlying substrate that has been exposed as a result of the photolithography.

To form complex features in an IC, several layers of processing need to be completed, with each of the layers being aligned within a given margin of error. That is, the amount of misalignment (also referred to as overlay) needs to be within certain tolerances in order to produce functioning devices. The overlay tolerances continue to decrease as ICs scale to smaller feature sizes. For example, the overlay budget of some lithography operations may be less than 10 nm.

In order to measure overlay, metrology structures (also sometimes referred to as "overlay targets", or just "targets") are printed onto the substrate during the photolithography process. The metrology structures are typically inspected using a microscope. The microscope includes a charge coupled device (CCD) to record the image of the metrology structures. Conventional CCDs may include an array of pixels that are typically 40-100 nm wide with a total field-of-view of the camera being between approximately 40 microns and 100 microns. This is significantly larger than the desired accuracy of the overlay (e.g., less than 10 nm). Due to the fact that the CCD pixel size is much larger than the desired level of accuracy, sub-pixel interpolation is required. Ultimately, the accuracy of this technique is limited by the fact that only a relatively small number of pixels are used to detect the overlay error. This, in combination with quantization effects arising from the large pixel size relative to the overlay error, may introduce errors in the overlay measurement. The impact of measurement error becomes more significant when the size of the pertinent features becomes smaller.

DESCRIPTION OF THE EMBODIMENTS

Figure 1A:
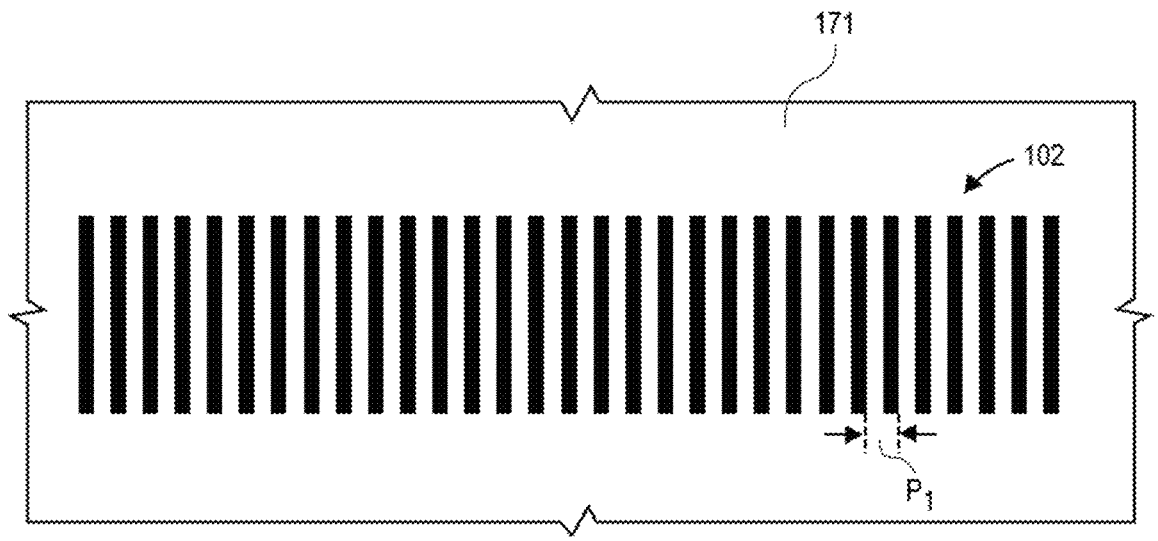
FIG. 1A is a plan view illustration of a first grating pattern with a first pitch, in accordance with an embodiment.

Embodiments described herein comprise semiconductor devices and methods of measuring overlay using overlay targets that include pattern recognition features and moiré fringe patterns. In the following description, numerous specific details are set forth, such as specific integration and material regimes, in order to provide a thorough understanding of embodiments of the present disclosure. It will be apparent to one skilled in the art that embodiments of the present disclosure may be practiced without these specific details. In other instances, well-known features, such as integrated circuit design layouts, are not described in detail in order to not unnecessarily obscure embodiments of the present disclosure. Furthermore, it is to be appreciated that the various embodiments shown in the Figures are illustrative representations and are not necessarily drawn to scale.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

As noted above, currently existing overlay targets do not provide the desired accuracy as devices continue to scale to smaller feature sizes. Accordingly, embodiments disclosed herein include overlay targets that have integrated gain factors that amplify any overlay errors. Particularly, embodiments disclosed herein include overlay targets that use interference patterns to measure the overlay. Peaks of the interference pattern shift relative to a reference point in order to indicate the amount of overlay error between two photolithography processes. In some embodiments, the reference point is a second interference pattern, a reference mark (e.g., a grating that does not produce an interference pattern), or both a second interference pattern and a reference mark. The shift in the interference pattern is equal to the overlay multiplied by the amplification factor, which makes measurement of small overlay easier. The amplification factor, as well as the periodicity of the interference pattern is dependent on the pitch and duty cycle of the gratings. Due to the amplification, an overlay error may be amplified by ten times or more, making the error easier to detect and measure. For example, the overlay may be amplified between five times or more. In a particular embodiment, the overlay may be amplified between 5 times and 120 times. As a result, the detection of overlay is more accurate and less reliant on interpolation and quantization.

Referring now to FIG. 1A, a plan view illustration of a first grating pattern 102 is shown, in accordance with an embodiment. In an embodiment, the first grating pattern 102 may be formed on a first reticle 171 (also sometimes referred to as a "mask"). The first reticle 171 may be used to form a first layer of features on a substrate. The first grating pattern 102 may comprise a plurality of substantially parallel openings through the reticle. The openings may have a first pitch $P_1$. For example, the first pitch $P_1$ may be from 100 nm and 500 nm. The duty cycle of the first grating pattern 102 may be defined as the amount of light area compared to the dark area in the pitch. For example, a fifty percent duty cycle would have equal areas of dark and light.

Figure 1B:
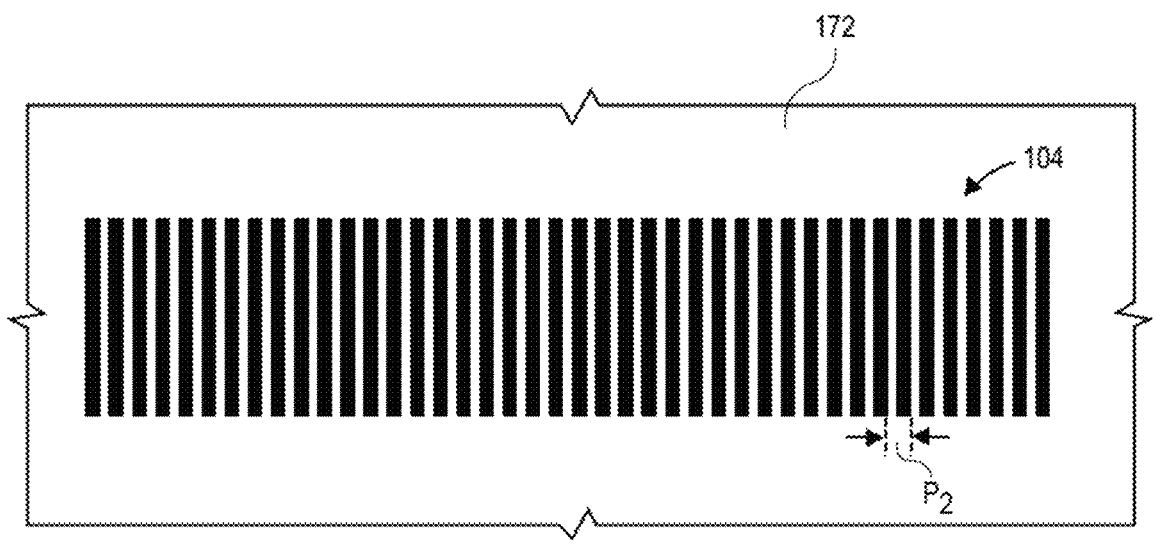
FIG. 1B is a plan view illustration of a second grating pattern with a second pitch that is different than the first pitch, in accordance with an embodiment.

Referring now to FIG. 1B, a plan view illustration of a second grating pattern 104 is shown, in accordance with an embodiment. In an embodiment, the second grating pattern 104 may be formed on a second reticle 172. The second reticle 172 may be used to form a second layer of features on a substrate. The second grating pattern 104 may comprise a plurality of substantially parallel openings through the second reticle 172. The openings may have a second pitch $P_2$. For example, the second pitch $P_2$ may be from 100 nm and 500 nm. In a particular embodiment, the second pitch $P_2$ is different than the first pitch $P_1$. Providing a first pitch $P_1$ that is different than the second pitch $P_2$ will result in the formation of an interference pattern when the first grating pattern 102 and the second grating pattern 104 are printed over the same region of a substrate. The interference pattern can be used to determine the overlay. The duty cycle of the second grating pattern 104 may be defined as the amount of light area compared to the dark area in the pitch. For example, a fifty percent duty cycle would have equal areas of dark and light.

Figure 1C:
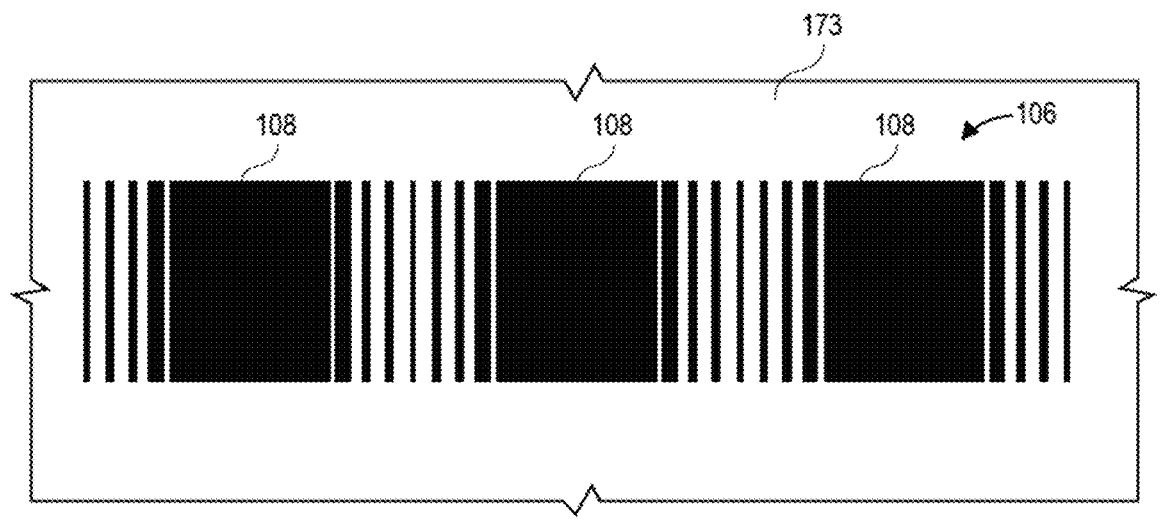
FIG. 1C is a plan view illustration of an interference pattern obtained by overlapping the first grating pattern with the second grating pattern, in accordance with an embodiment.
Figure 1D:
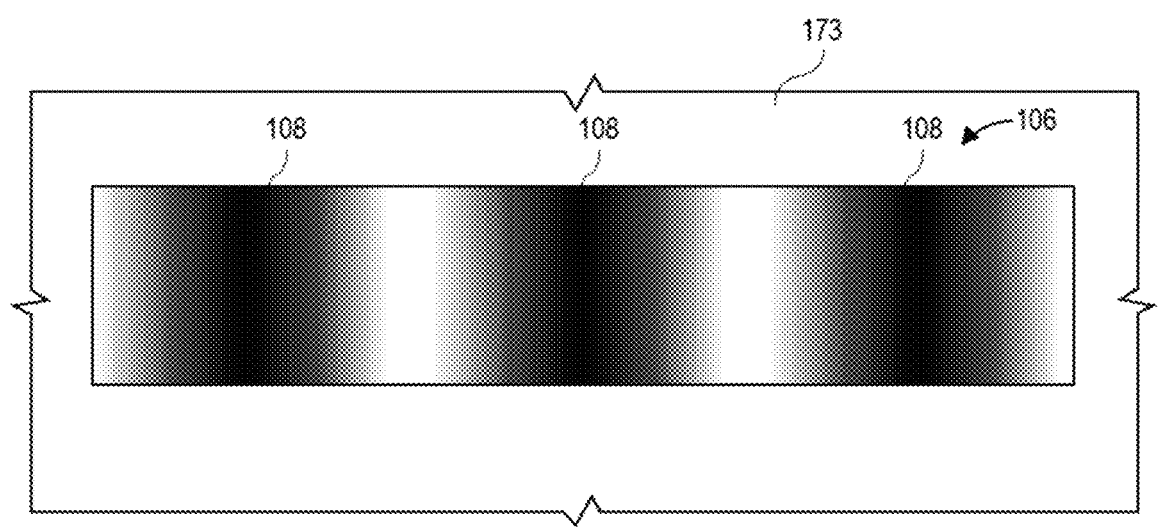
FIG. 1D is a grayscale representation of the interference pattern, in accordance with an embodiment.

Referring now to FIG. 1C, a plan view illustration of a substrate 173 onto which the first grating pattern 102 and the second grating pattern 104 are printed is shown, in accordance with an embodiment. As shown, when the first grating pattern 102 and the second grating pattern 104 are printed over each other, an interference pattern 106 is formed. In an embodiment, the interference pattern 106 may be a moiré interference pattern 106. As shown in FIG. 1C, the interference pattern 106 includes peaks 108. The peaks 108 are regularly spaced. That is, the interference pattern 106 may be substantially periodic in nature. While the interference pattern 106 is illustrated as having discrete openings (i.e., black regions), it is to be appreciated that when viewed under a microscope or any other metrology tool, the interference pattern 106 may be seen as a gradient. An example of a gradient interference pattern 106 is shown in FIG. 1D. As shown, the interference pattern 106 may consist of a grayscale image with variable intensity. For example, peaks 108 have high intensities.

The amount the peaks 108 are shifted corresponds to the overlay. Particularly, the observed shift of the peaks 108 ($\Delta X$) represents the overlay $\Delta x$ multiplied by a gain factor (A). The gain factor is a function of the difference between the first pitch $P_1$ and the second pitch $P_2$. Particularly, the gain factor (A) may be represented by Equation 1, and the overlay ($\Delta x$) may be represented by Equation 2.

$$A = \frac{P_1}{P_2 - P_1} \quad \text{(Equation 1)}$$

$$\Delta x = \frac{\Delta X}{A} \quad \text{(Equation 2)}$$

Those skilled in the art will recognize that an overlay target that includes only a single interference pattern 106 will not have a reference point to which the peaks 108 are compared against. Accordingly, embodiments disclosed herein include overlay targets that comprise a pair of interference patterns 106 and a pattern recognition feature.

Figure 2A:
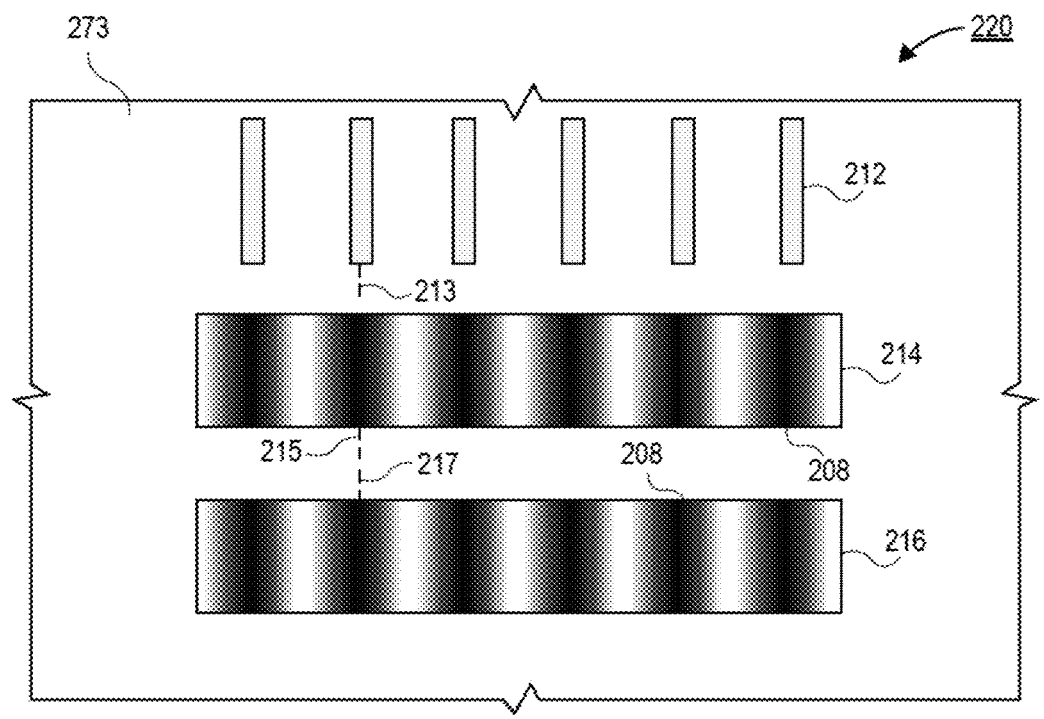
FIG. 2A is a plan view illustration of an overlay block that includes a pattern recognition feature, a first interference pattern, and a second interference pattern, where there is no misalignment between reticles used to form the overlay block, in accordance with an embodiment.

Referring now to FIG. 2A, a plan view illustration of an overlay block 220 that is printed onto a substrate 273 is shown, in accordance with an embodiment. As shown, the overlay block 220 comprises a first interference pattern 214, a second interference pattern 216, and a pattern recognition feature 212. The overlay block 220 may be printed onto the substrate 273 using two reticles. A first grating pattern and a second grating pattern may be printed using the first reticle, and a third grating pattern and a fourth grating pattern may be printed using the second reticle. The pattern recognition feature 212 may be printed using either the first reticle or the second reticle.

In an embodiment, the first grating pattern (with pitch $P_1$) may be overlapped by the third grating pattern (with pitch $P_3$) to form the first interference pattern 214, and the second grating pattern (with pitch $P_2$) may be overlapped by the fourth grating pattern (with pitch $P_4$) to form the second interference pattern 216. In a particular embodiment, the first interference pattern 214 may be constructed to have a positive gain factor and the second interference pattern 216 may be constructed to have a negative gain factor. Accordingly, when the overlay is determined by referencing the first interference pattern 214 to the second interference pattern 216, the total gain is increased. For example, if the gain factor of the first interference pattern 214 is chosen to be positive five times and the gain factor of the second interference pattern 216 is chosen to be negative five times, then the total gain factor would be ten times. Particularly, the total gain ($A_{total}$) is represented by Equation 3, and the overlay ($\Delta x$) is represented by Equation 4.

$$A_{total} = \left(\frac{P_1}{P_3 - P_1}\right) - \left(\frac{P_2}{P_4 - P_2}\right) \quad \text{(Equation 3)}$$

$$\Delta x = \frac{\Delta X}{A_{total}} \quad \text{(Equation 4)}$$

In addition to referencing the first interference pattern 214 to the second interference pattern 216, overlay measurements may also be made by referencing either (or both) of the first interference pattern 214 and the second interference pattern 216 to the pattern recognition feature 212. In such embodiments, the measured overlay would be found using equations similar to Equation 1 and Equation 2 since only a single gain factor is utilized. Accordingly, the overlay block 220 includes a plurality of different ways to measure the overlay. One or more of the overlay measurements may be used to provide a highly accurate measure of the overlay.

Additionally, it is to be appreciated that the inclusion of a pattern recognition feature 212 allows for easy implementation of such overlay blocks using existing overlay metrology equipment. Since only a single reticle exposure is used to print the pattern recognition feature 212, a stable and easily discernable pattern is provided to which the overlay metrology equipment can use to conduct the measurements. Additionally, while the pattern recognition feature 212 is shown as being a grating, it is to be appreciated that embodiments may include any suitable feature or features.

In FIG. 2A, the overlay block 220 is formed by the patterning of a first reticle and a second reticle that are perfectly aligned. That is, the peaks 208 of the first interference pattern 214 have a centerline 215 that is perfectly aligned with the centerline 217 of the peaks 208 of the second interference pattern 216. Additionally, the centerline 213 of one of the openings of the pattern recognition feature 212 is aligned with the centerline 215 and the centerline 217. That is, there is no measured overlay $\Delta X$.

Figure 2B:
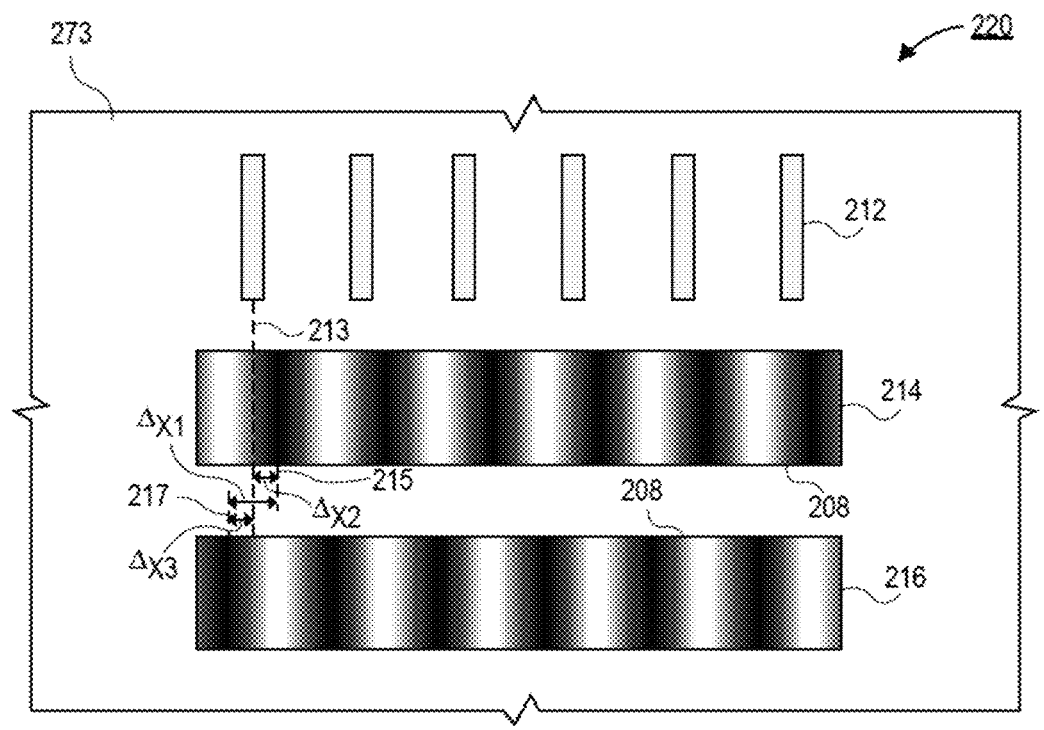
FIG. 2B is a plan view illustration of an overlay block that includes a pattern recognition feature, a first interference pattern, and a second interference pattern, where there is some misalignment between reticles used to form the overlay block, in accordance with an embodiment.

However, in FIG. 2B a plan view illustration of an overlay block 220 that exhibits a measured overlay is shown, in accordance with an embodiment. As shown, there are three different measured overlays ($\Delta X_1$, $\Delta X_2$, and $\Delta X_3$). Due to the different gain factors for each measurement, actual overlay ($\Delta x$) of each measured overlay should be approximately equal to each other. The first measured overlay $\Delta X_1$ is the overlay measurement from comparing centerline 215 of peaks 208 of the first interference pattern 214 to centerline 217 of peaks 208 of the second interference pattern 216. The second measured overlay $\Delta X_2$ is the overlay measurement from comparing centerline 213 of the pattern recognition feature 212 to centerline 215 of peaks 208 of the first interference pattern 214. The third measured overlay $\Delta X_3$ is the overlay measurement from comparing centerline 213 of the pattern recognition feature 212 to centerline 217 of peaks 208 of the second interference pattern 216. Furthermore, while a single peak 208 in each interference pattern 214, 216 is shown as being used to determine the measured overlay $\Delta X$, it is to be appreciated that multiple peaks 208 may be used to provide additional measurements and further improve accuracy.

An advantage of embodiments disclosed herein is that the interference patterns 214 and 216 are imaged onto a relatively large fraction of the pixels forming the CCD array. As such, a large portion of the CCD array is used to extract the overlay information. In contrast, in conventional techniques overlay information is contained only in feature edges, which in turn are captured by a relatively small number of pixels on the CCD array. Thus, in the conventional method, most of the pixels in the CCD array provide no useful overlay information.

In FIGS. 2A and 2B, a single overlay block 220 is shown. Particularly, the overlay blocks 220 provide a means for determining the overlay along a single axis. However, it is to be appreciated that a plurality of overlay blocks 220 may be combined in an overlay target to provide overlay measurements in more than one axis.

Figure 3A:
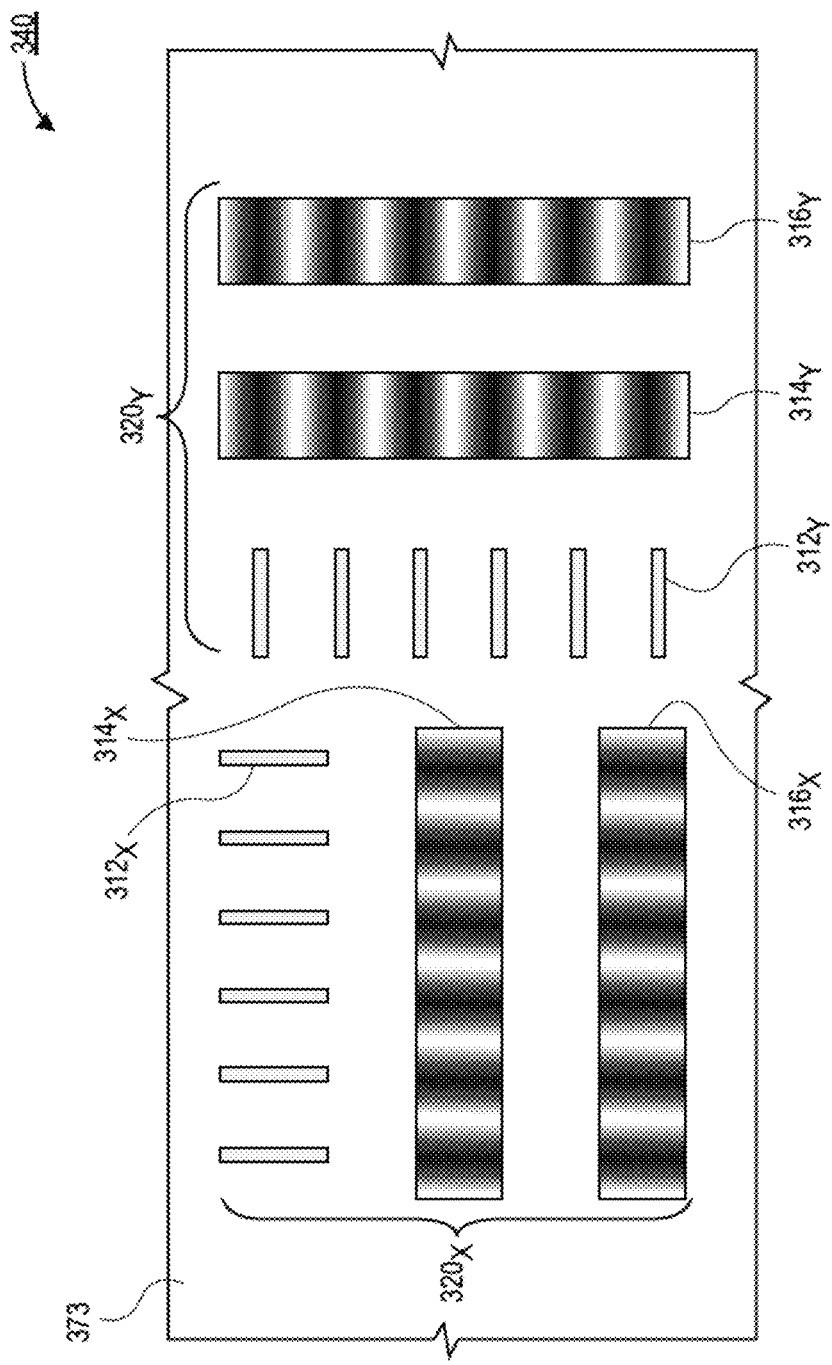
FIG. 3A is a plan view illustration of an overlay target that includes a first overlay block for measuring overlay in the X-direction, and a second overlay block for measuring overlay in the Y-direction, in accordance with an embodiment.

Referring now to FIG. 3A, a plan view illustration of an overlay target 340 on a substrate 373 is shown, in accordance with an embodiment. In an embodiment, overlay target 340 may comprise a first overlay block $320_X$ and a second overlay block $320_Y$. The first overlay block $320_X$ may be oriented to provide overlay measurements along the X-axis, and the second overlay block $320_Y$ may be oriented to provide overlay measurements along the Y-axis. Particularly, the first overlay block $320_X$ may comprise a first pattern recognition feature $312_X$, a first interference pattern $314_X$, and a second interference pattern $316_X$. The first pattern recognition feature $312_X$, the first interference pattern $314_X$, and the second interference pattern $316_X$ may be adjacent to each other and substantially parallel to each other. The second overlay block $320_Y$ may comprise second pattern recognition feature $312_Y$, a third interference pattern $314_Y$, and a fourth interference pattern $316_Y$. The second pattern recognition feature $312_Y$, the third interference pattern $314_Y$, and the fourth interference pattern $316_Y$ may be adjacent to each other and substantially parallel to each other.

Figure 3B:
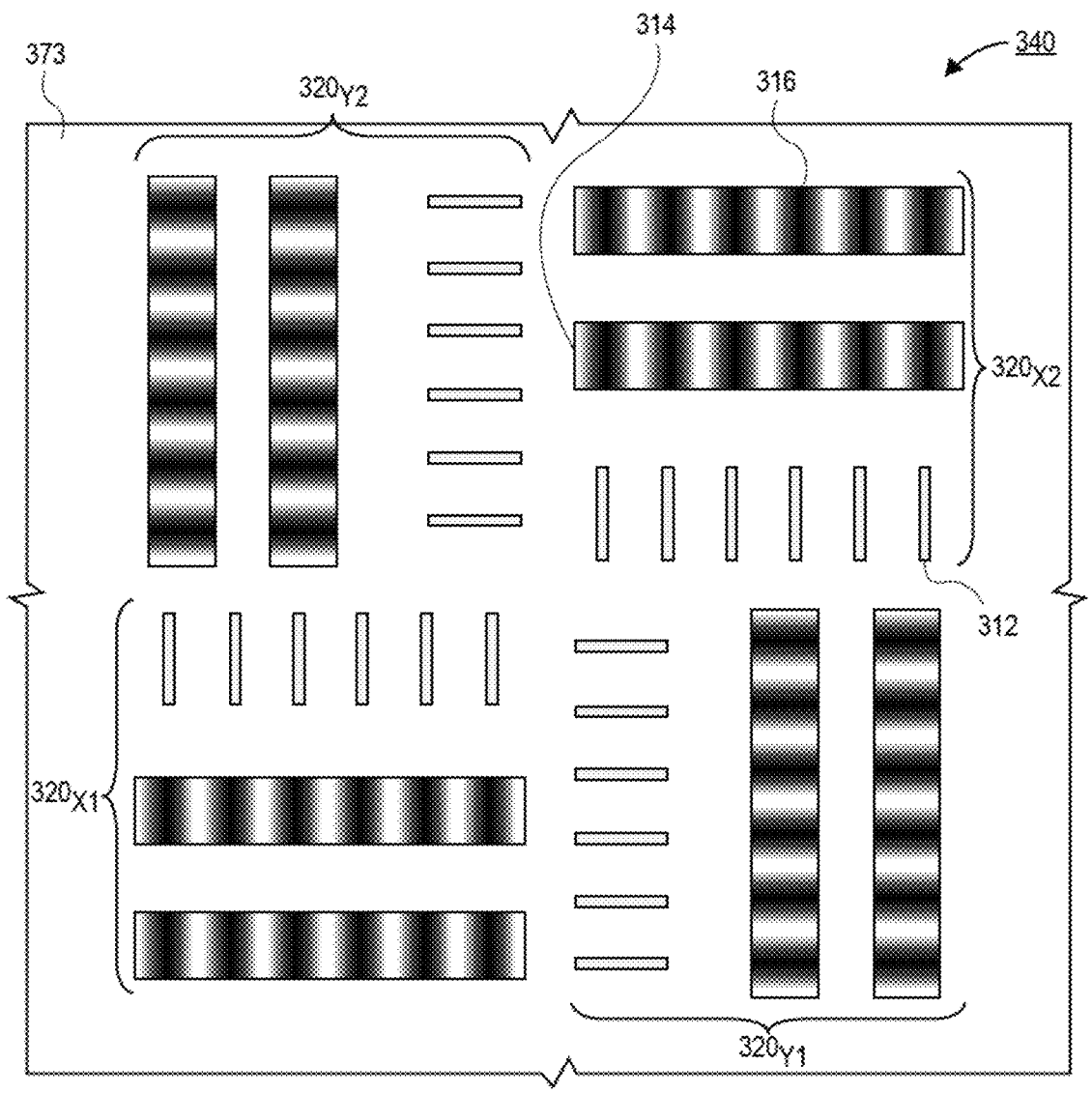
FIG. 3B is a plan view illustration of an overlay target that includes a plurality of overlay blocks that provide overlay measurements with 180° symmetry with a pattern recognition feature as the innermost grating, in accordance with an embodiment.
Figure 3C:
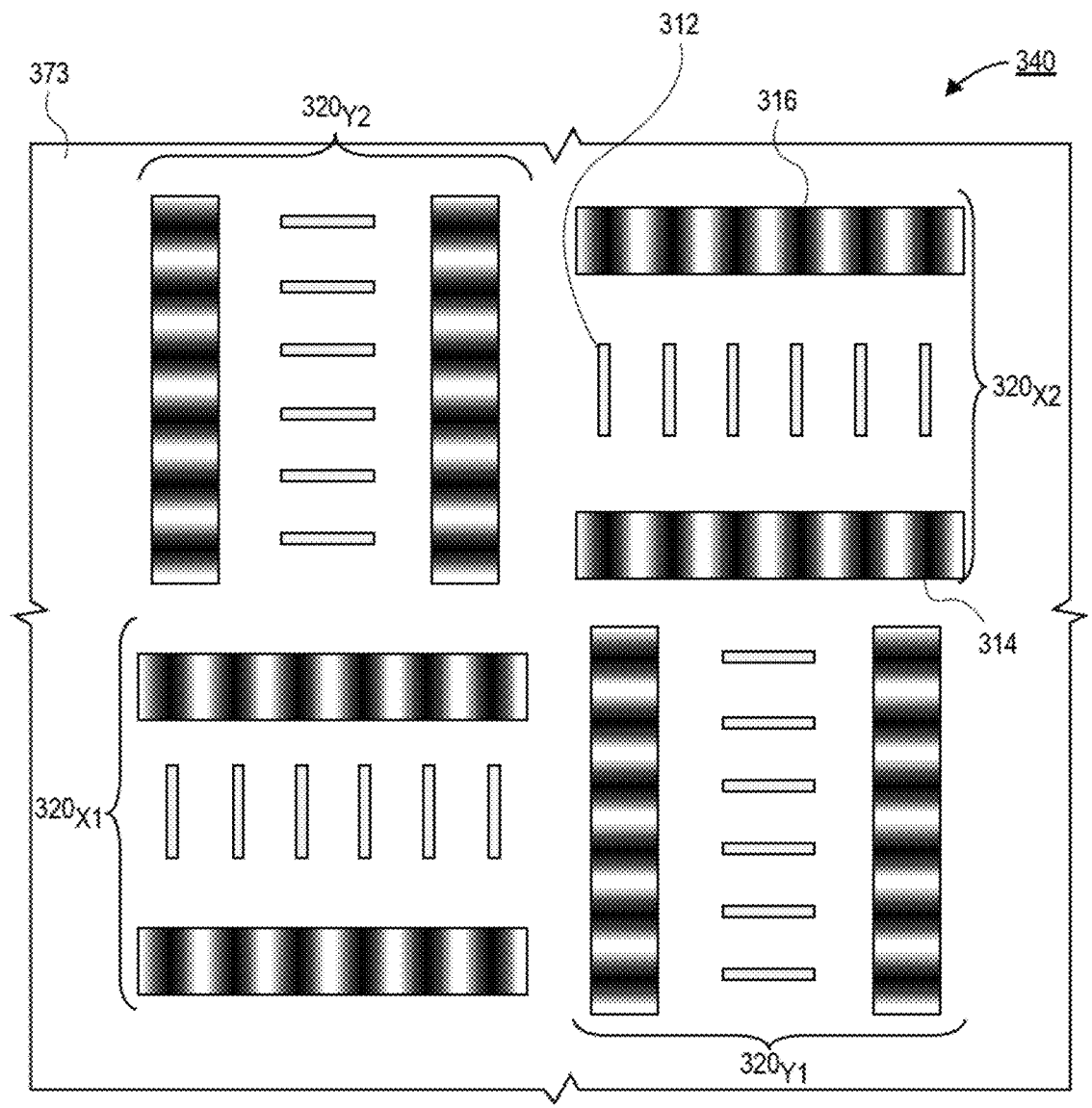
FIG. 3C is a plan view illustration of an overlay target that includes a plurality of overlay blocks that provide overlay measurements with 180° symmetry with a pattern recognition feature as a middle grating, in accordance with an embodiment.
Figure 3D:
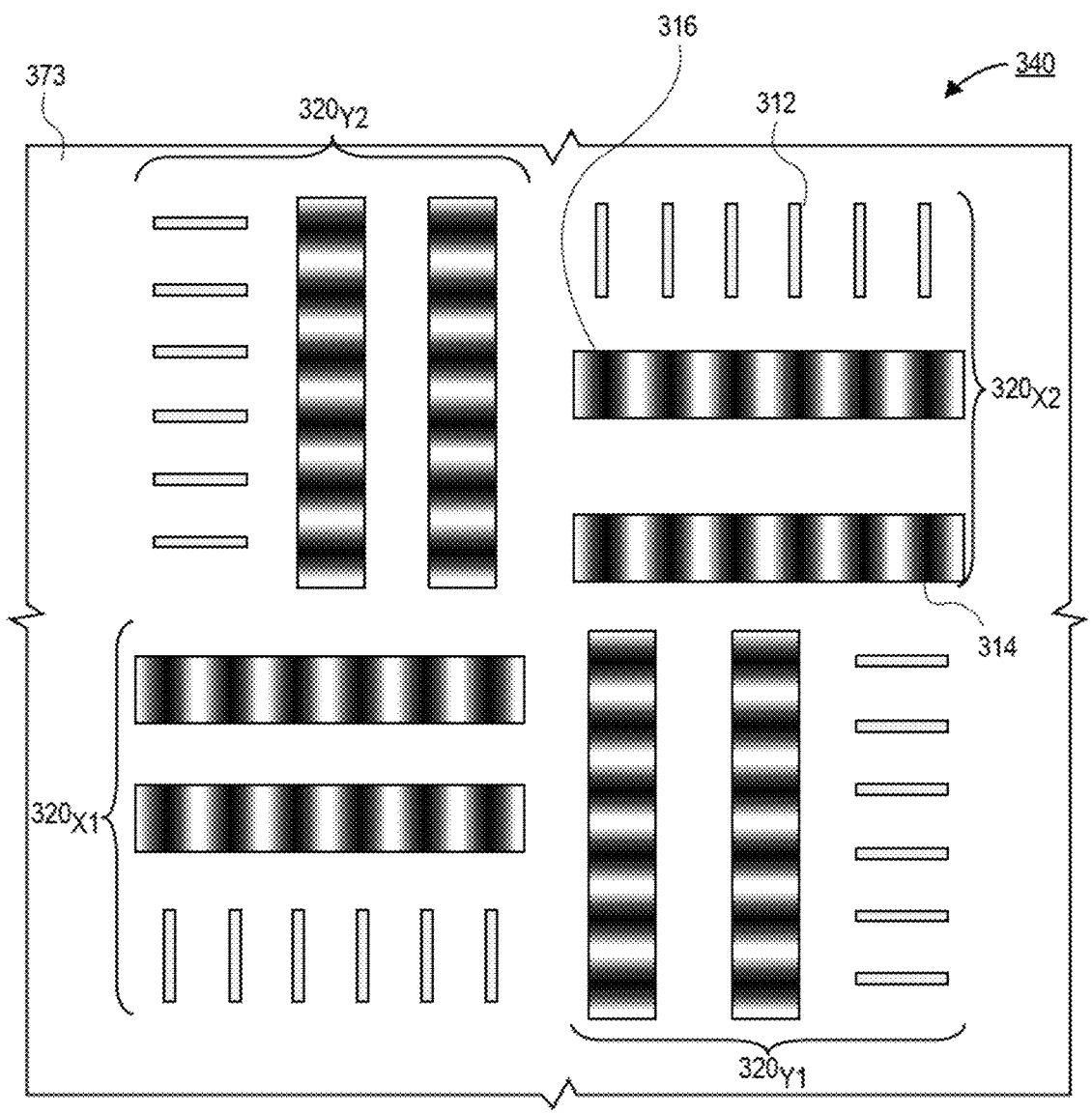
FIG. 3D is a plan view illustration of an overlay target that includes a plurality of overlay blocks that provide overlay measurements with 180° symmetry with a pattern recognition feature as the outermost grating, in accordance with an embodiment.

Referring now to FIG. 3B, a plan view illustration of an overlay target 340 on a substrate 373 is shown, in accordance with an additional embodiment. In an embodiment, the overlay target 340 may comprise a plurality of overlay blocks 320. For example, overlay target 340 may comprise a first overlay block $320_{X1}$, a second overlay block $320_{Y1}$, a third overlay block $320_{X2}$, and a fourth overlay block $320_{Y2}$. The overlay blocks 320 may be arranged to provide an overlay target 340 that has 180° symmetry. Such an embodiment also provides two overlay blocks 320 for measuring overlay in the X-axis (i.e., first overlay block $320_{X1}$ and third overlay block $320_{X2}$) and two overlay blocks 320 for measuring overlay in the Y-axis (i.e., second overlay block $320_{Y1}$ and fourth overlay block $320_{Y2}$). Each of the overlay blocks 320 may be substantially similar to overlay blocks 320 described with respect to the overlay blocks 320 described with respect to FIG. 3A. For example, each overlay block 320 may comprise a pattern recognition feature 312, a first interference pattern 314, and a second interference pattern 316. In FIG. 3B, the pattern recognition feature 312 is shown as being the innermost feature of each of the overlay blocks 320. However, embodiments are not limited to such configurations. For example, in FIG. 3C the pattern recognition feature 312 is a middle feature of each overlay block 320, and in FIG. 3D the pattern recognition feature 312 is an outermost feature of each overlay block 320.

Figure 4:
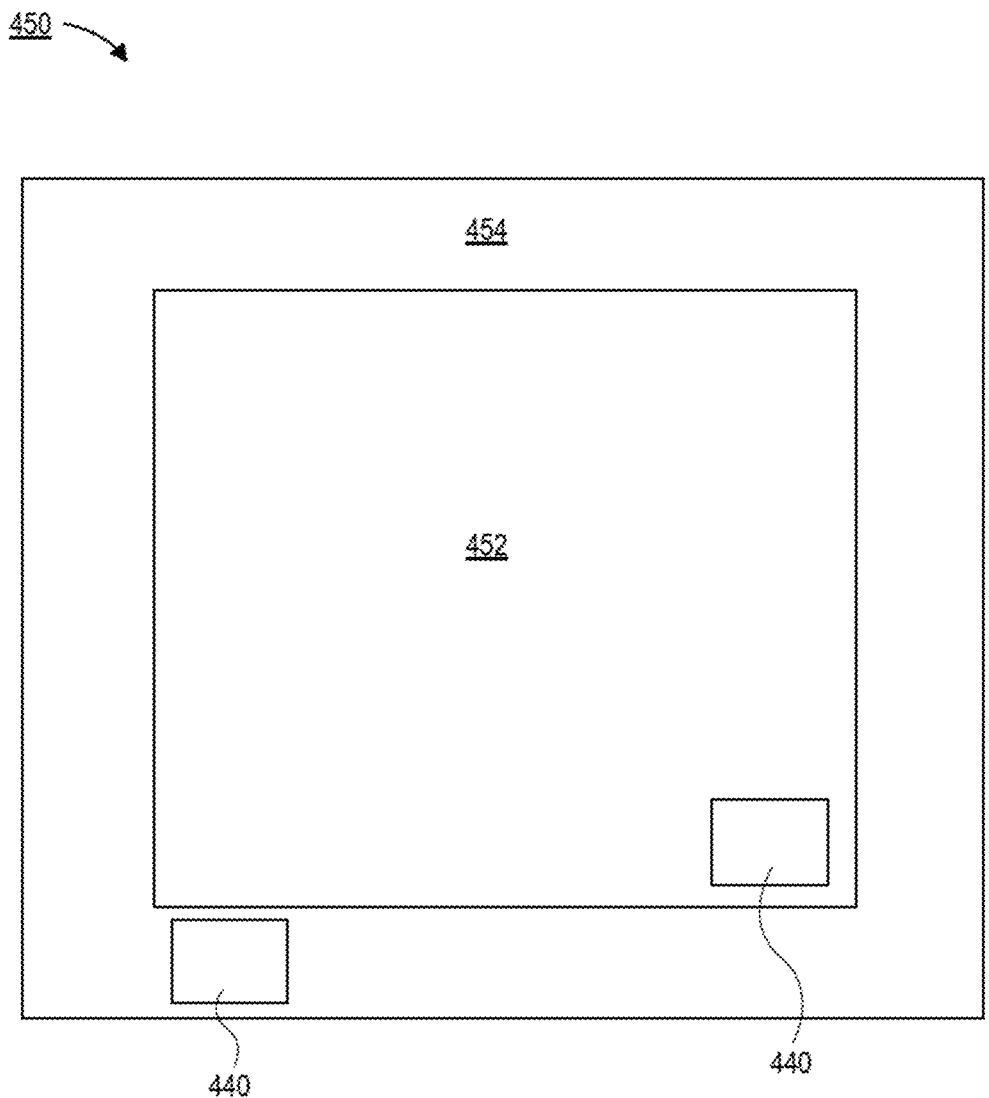
FIG. 4 is a plan view illustration of a reticle with an active field region that shows locations where overlay targets may be optionally located, in accordance with an embodiment.

Referring now to FIG. 4, a plan view illustration of a reticle 450 is shown, in accordance with an embodiment. In an embodiment, the reticle 450 may comprise an active field region 452 and a periphery region 454. The active field region 452 may comprise a pattern for forming portions of active devices (e.g., transistors, interconnects, etc.) and the periphery region 454 may be where scribe lines are located on the substrate. In an embodiment, the overlay target 440 may be located in the periphery region 454 of the reticle 450. In such embodiments, the overlay target 440 may be printed in the scribe line of the substrate. As such, the overlay target 440 (or portions of the overlay target 440) may be removed during singulation of the substrate. In other embodiments, the overlay target 440 may be located in the active field region 452 of the reticle 450. In such embodiments, the overlay target 440 may remain in the die after singulation.

In an embodiment, the overlay target 440 on the reticle may comprise a first grating pattern and a second grating pattern. That is, the overlay target 440 may comprise a portion of a first interference pattern (i.e., the first grating pattern) and a portion of a second interference pattern (i.e., the second grating pattern). The remaining portion of the first interference pattern (i.e., a third grating pattern) and the remaining portion of the second interference pattern (i.e., a fourth grating pattern) may be provided on a second reticle (not shown). In some embodiments, a pattern recognition feature may also be provided in the overlay target 440 on the reticle 450. In other embodiments, the pattern recognition pattern may be provided on the second reticle.

Figure 5:
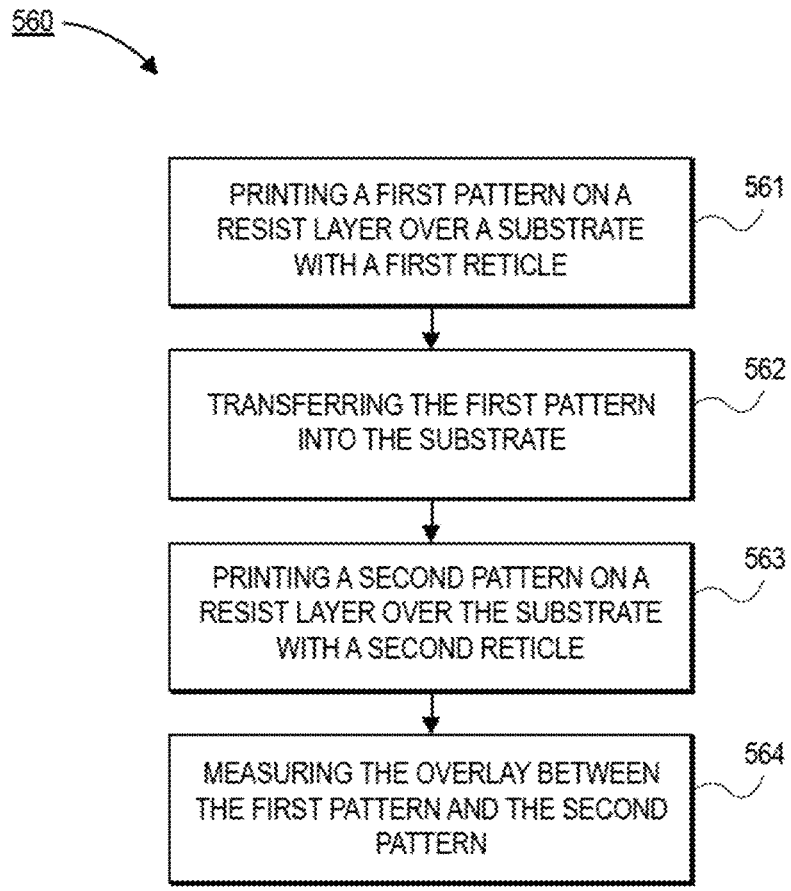
FIG. 5 is a process flow diagram of a process for measuring overlay using a first reticle and a second reticle that print a pattern recognition feature, a first interference pattern, and a second interference pattern, in accordance with an embodiment.

Referring now to FIG. 5, a process flow diagram of a process 560 for forming an overlay target on a substrate is shown, in accordance with an embodiment. In an embodiment, the process 560 may begin with operation 561 which includes printing a first pattern on a first resist layer over a substrate with a first reticle. In an embodiment, the first pattern may comprise one or more overlay blocks. For example, each of the overlay blocks of the first pattern may comprise a first grating pattern and a second grating pattern. In some embodiments, the first pattern may also include a pattern recognition feature. In an embodiment, the first grating pattern may comprise a first pitch and the second grating pattern may comprise a second pitch.

In an embodiment, process 560 may further comprise operation 562 which comprises transferring the first pattern into the substrate. In an embodiment, the first pattern is transferred into the substrate using an etching process or the like. In some embodiments, the first resist layer is removed from the substrate after the first pattern is transferred into the substrate. After the first resist layer is removed, a second resist layer may be disposed over the substrate. In other embodiments, the first resist layer may not be removed, and a second resist layer may be disposed over the first resist layer.

In an embodiment, process 560 may further comprise operation 563 which comprises printing a second pattern on the second resist layer over the substrate with a second reticle. In an embodiment, the second pattern may comprise one or more overlay blocks. For example, each of the overlay blocks of the second pattern may comprise a third grating pattern and a fourth grating pattern. The third grating pattern may comprise a third pitch that is different than the first pitch, and the fourth grating pattern may comprise a fourth pitch that is different than the second pitch. The third grating pattern may overlap the first grating pattern to form a first interference pattern, and the fourth grating pattern may overlap the second grating pattern to form a second interference pattern. In embodiments where the first pattern on the first reticle does not include a pattern recognition feature, the second pattern on the second reticle may comprise the pattern recognition feature.

In an embodiment, process 560 may further comprise operation 564 which comprises measuring an overlay between the first pattern and the second pattern. In an embodiment, measuring the overlay may comprise comparing a position of one or more peaks of the first interference pattern with a position of one or more peaks of the second interference pattern. In an embodiment, the position of one or more peaks of the first interference pattern and/or the position of one or more peaks of the second interference pattern may be compared with a position of the pattern recognition pattern.

Figure 6A:
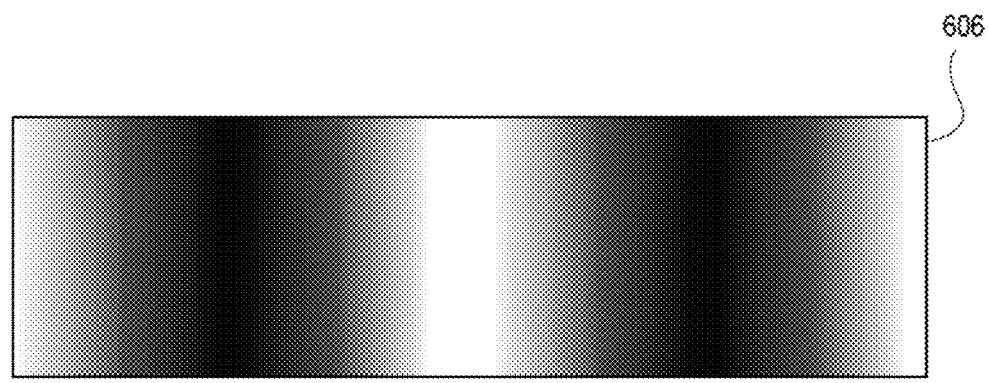
FIG. 6A is a grayscale representation of an interference pattern, in accordance with an embodiment.
Figure 6B:
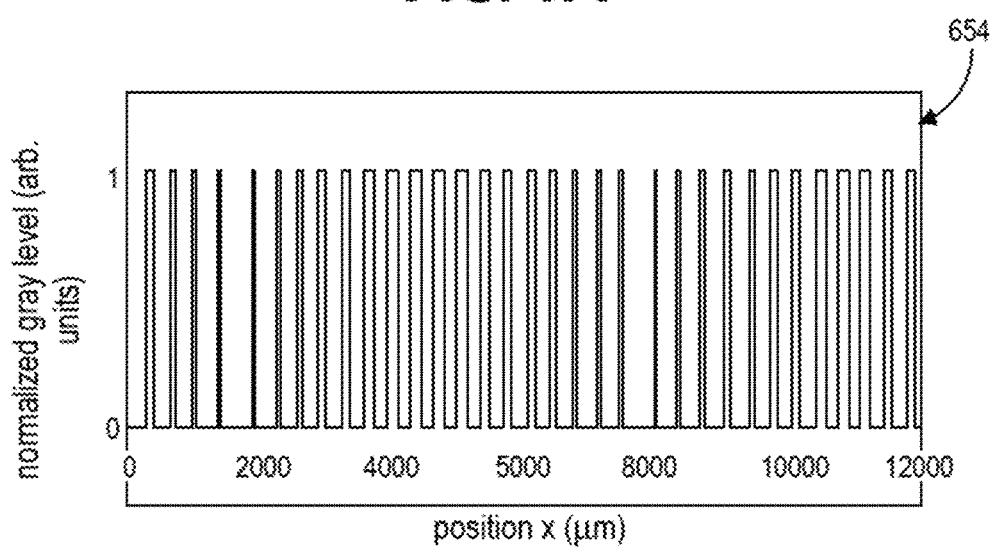
FIG. 6B is a graph of a normalized gray level across the interference pattern, in accordance with an embodiment.
Figure 6C:
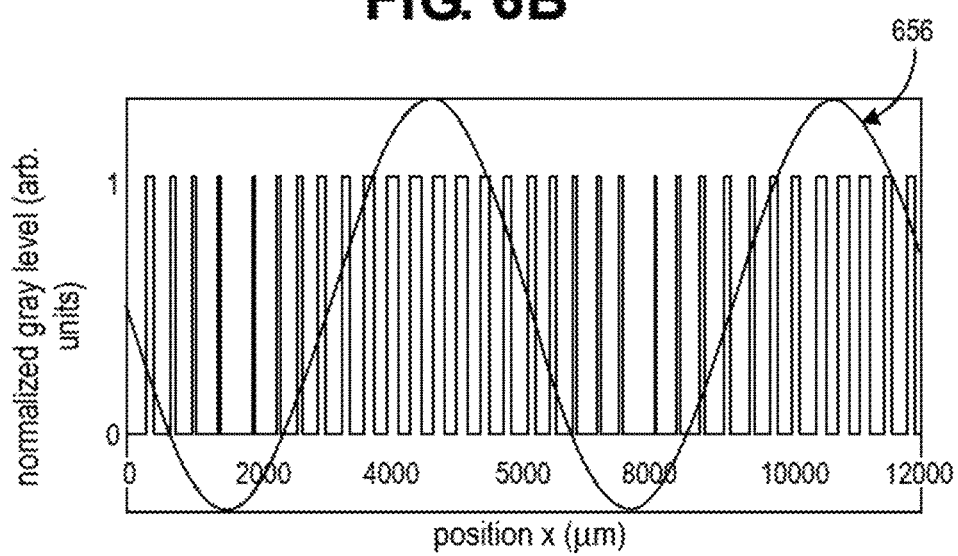
FIG. 6C is the graph in FIG. 6B with a function fitted to the normalized gray levels, in accordance with an embodiment.

Referring now to FIGS. 6A-6C, a technique for measuring an overlay from an interference pattern 606 is shown, in accordance with an embodiment. FIG. 6A illustrates an interference pattern 606 that was produced using the method described above. FIG. 6B illustrates the interference pattern 606 reduced to a one-dimensional intensity pattern 654, obtained by averaging the interference pattern 606 in the direction parallel to the grating openings. FIG. 6C illustrates a cosine graph 656 fitted to the one-dimensional intensity profile 654. The cosine graph 656 can be determined using the following equations. First, the period of the interference pattern (T) is determined using Equation 5, and the cosine graph 656 is defined by Equation 6. In Equation 5, $P_1$ is the first pitch and $P_2$ is the second pitch. In Equation 6, x is the distance in the direction of the measurement and $\phi$ is the phase shift. Since the period T is determined using the pitches of the gratings, the fitting of the cosine graph is accomplished by varying $\phi$.

$$T = \frac{P_2}{\frac{P_2}{P_1} - P_1} \quad \text{(Equation 5)}$$

$$\cos\frac{2\pi x}{T} + \phi \quad \text{(Equation 6)}$$

A shift in the interference pattern of one period must induce a $2\pi$ phase shift. As a result, the phase shift can be given by Equation 7.

$$\phi = 2\pi\left(\frac{\Delta X}{T}\right) \quad \text{(Equation 7)}$$

The phase shift of the equation can be used to determine the overlay error. If Equations 1 and 7 are substituted into Equation 2, then Equation 8 is produced.

$$\Delta x = P_2\left(\frac{\phi}{2\pi}\right) = \left(\frac{\phi}{2\pi}\right)\left(\frac{T}{A}\right) \quad \text{(Equation 8)}$$

The overlay error can be determined using Equation 8. As can be seen, one needs only the pitch of the second grating and the phase shift fitted cosine graph 656 to determine the overlay of two printed layers.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 7:
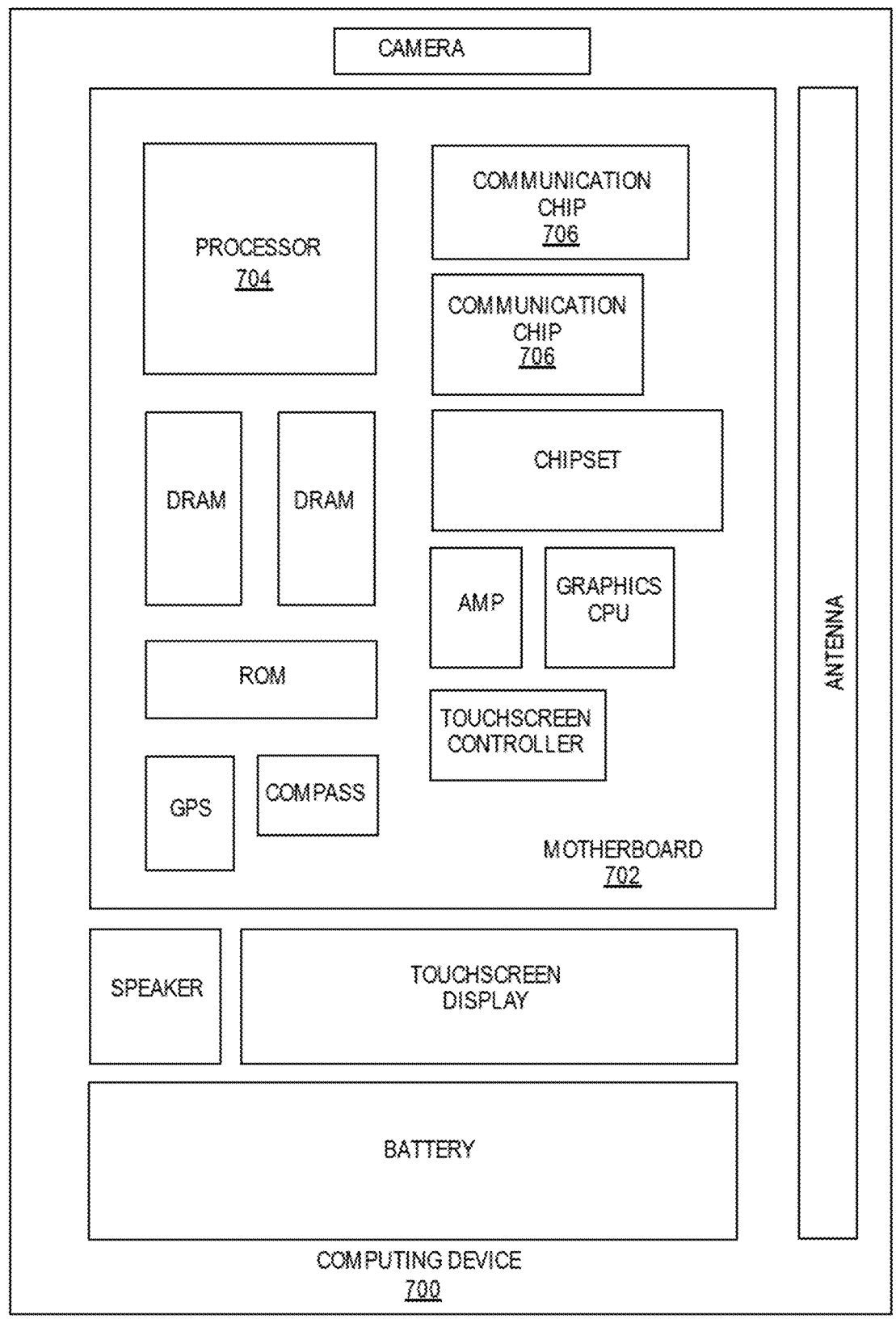
FIG. 7 illustrates a computing device in accordance with one implementation of an embodiment of the disclosure.

FIG. 7 illustrates a computing device 700 in accordance with one implementation of an embodiment of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In an embodiment, the integrated circuit die of the processor may comprise an overlay target with a first interference pattern, a second interference pattern, and a pattern recognition feature, or be fabricated using such an overlay target, as described herein. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In an embodiment, the integrated circuit die of the communication chip 706 may comprise an overlay target with a first interference pattern, a second interference pattern, and a pattern recognition feature, or be fabricated using such an overlay target, as described herein.

In further implementations, another component housed within the computing device 700 may comprise an overlay target with a first interference pattern, a second interference pattern, and a pattern recognition feature, or be fabricated using such an overlay target, as described herein.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
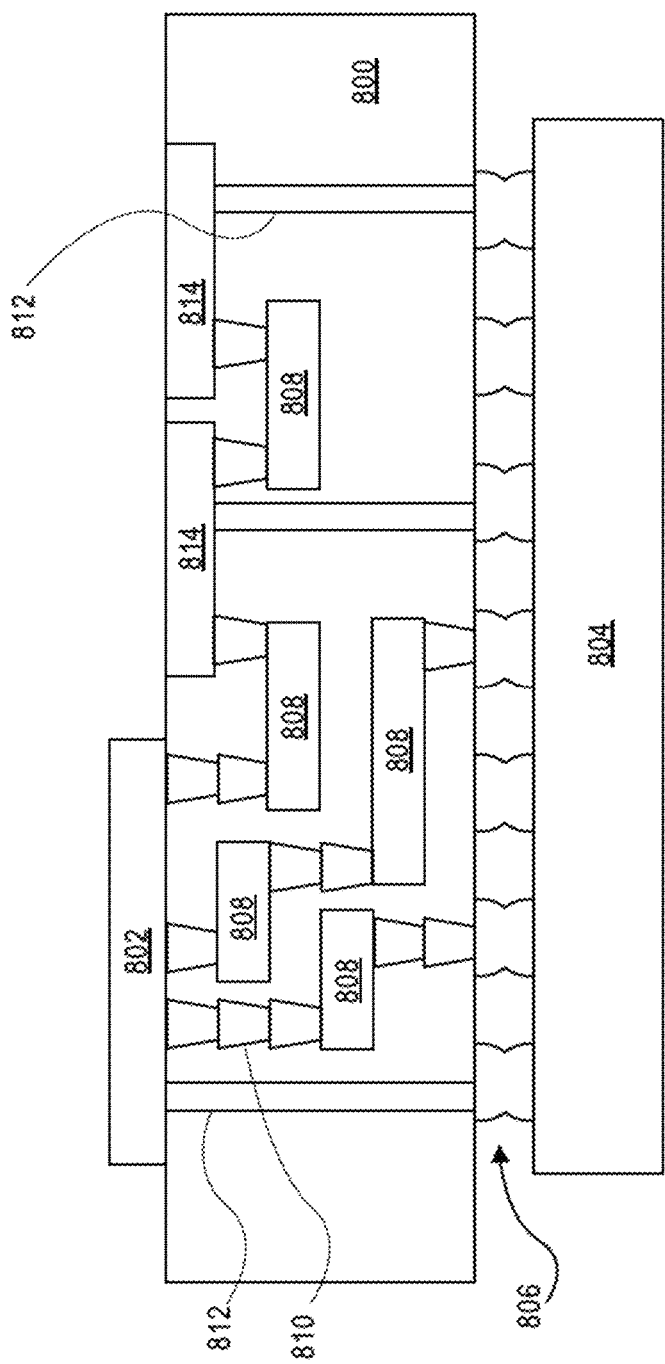
FIG. 8 is an interposer implementing one or more embodiments of the disclosure.

FIG. 8 illustrates an interposer 800 that includes one or more embodiments of the disclosure. The interposer 800 is an intervening substrate used to bridge a first substrate 802 to a second substrate 804. The first substrate 802 may be, for instance, an integrated circuit die. The second substrate 804 may be, for instance, a memory module, a computer motherboard, or another integrated circuit die. In an embodiment, one of both of the first substrate 802 and the second substrate 804 may comprise an overlay target with a first interference pattern, a second interference pattern, and a pattern recognition feature, or be fabricated using such an overlay target, in accordance with embodiments described herein. Generally, the purpose of an interposer 800 is to spread a connection to a wider pitch or to reroute a connection to a different connection. For example, an interposer 800 may couple an integrated circuit die to a ball grid array (BGA) 806 that can subsequently be coupled to the second substrate 804. In some embodiments, the first and second substrates 802/804 are attached to opposing sides of the interposer 800. In other embodiments, the first and second substrates 802/804 are attached to the same side of the interposer 800. And in further embodiments, three or more substrates are interconnected by way of the interposer 800.

The interposer 800 may be formed of an epoxy resin, a fiberglass-reinforced epoxy resin, a ceramic material, or a polymer material such as polyimide. In further implementations, the interposer 800 may be formed of alternate rigid or flexible materials that may include the same materials described above for use in a semiconductor substrate, such as silicon, germanium, and other group III-V and group IV materials.

The interposer 800 may include metal interconnects 808 and vias 810, including but not limited to through-silicon vias (TSVs) 812. The interposer 800 may further include embedded devices 814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 800. In accordance with embodiments of the disclosure, apparatuses or processes disclosed herein may be used in the fabrication of interposer 800.

Thus, embodiments of the present disclosure may comprise a BEOL stack that comprises one or more plugs, vias, and/or cuts that are manufactured using an edge placement error mitigation scheme, and the resulting structures.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

Example 1: a method of measuring overlay, comprising: printing a first pattern on a first resist layer over a substrate with a first reticle, wherein the first pattern comprises a first grating having a first pitch and second grating having a second pitch; transferring the first pattern into the substrate; printing a second pattern on a second resist lay over the substrate with a second reticle, wherein the second pattern comprises a third grating having a third pitch that is different than the first pitch and a fourth grating having a fourth pitch that is different than the second pitch, wherein the third grating overlaps the first grating to provide a first interference pattern and the fourth grating overlaps the second grating to provide a second interference pattern, and wherein the first pattern or the second pattern further comprises a pattern recognition feature; and measuring an overlay between the first pattern and the second pattern by comparing two or more of the first interference pattern, the second interference pattern, and the pattern recognition feature.

Example 2: the method of Example 1, wherein the pattern recognition feature is adjacent to the first interference pattern, and wherein the first interference pattern is adjacent to the second interference pattern.

Example 3: the method of Example 2, wherein comparing the first interference pattern to the second interference pattern comprises measuring a position of a first peak of the first interference pattern relative to a position of a second peak of the second interference pattern.

Example 4: the method of Examples 1-3, wherein the first interference pattern provides a positive gain in the overlay and the second interference pattern provides a negative gain in the overlay.

Example 5: the method of Example 4, wherein the positive gain and the negative gain are between 5 times and 120 times.

Example 6: the method of Examples 1-5, wherein the first interference pattern and the second interference pattern are moiré interference patterns.

Example 7: a lithography reticle set, comprising: a first reticle, wherein the first reticle comprises: a first grating having a first pitch; and a second grating having a second pitch, wherein the first grating is adjacent to the first grating; and a second reticle, wherein the second reticle comprises: a third grating having a third pitch, wherein the third pitch is different than the first pitch; and a fourth grating having a fourth pitch, wherein the fourth pitch is different than the first pitch, and wherein the third grating overlaps the first grating and the fourth grating overlaps the second grating when two or more edges of the first reticle are aligned with two or more edges of the second reticle; and wherein the first reticle or the second reticle further comprises a pattern recognition feature.

Example 8: the lithography reticle set of Example 7, wherein the first reticle and the second reticle each comprise an active field region and a peripheral region.

Example 9: the lithography reticle set of Example 8, wherein the first grating and the second grating are positioned in the peripheral region of the first reticle, and wherein the third grating and the fourth grating are positioned in the peripheral region of the second reticle.

Example 10: the lithography reticle set of Example 8, wherein the first grating and the second grating are positioned in the active field region of the first reticle, and wherein the third grating and the fourth grating are positioned in the active field region of the second reticle.

Example 11: the lithography reticle set of Examples 7-10, wherein the pattern recognition feature comprises a fifth grating.

Example 12: the lithography reticle set of Examples 7-11, wherein a first interference pattern is formed by overlapping the first grating with the third grating, and wherein a second interference pattern is formed by overlapping the second grating with the fourth grating.

Example 13: the lithography reticle set of Example 12, wherein the first interference pattern and the second interference pattern are moiré interference patterns.

Example 14: the lithography reticle set of Examples 7-13, wherein the first reticle further comprises a plurality of first grating patterns and a plurality of second grating patterns, and wherein the second reticle further comprises a plurality third grating patterns and a plurality of fourth grating patterns.

Example 15: the lithography reticle set of Example 14, wherein the plurality of first grating patterns and the plurality of second grating patterns are arranged with 180° symmetry.

Example 16: a method of measuring overlay, comprising: printing a first overlay target on a first photoresist over a substrate; transferring the first overlay target into the substrate; printing a second overlay target on a second photoresist over the substrate, wherein the second overlay target overlaps the first overlay target, wherein the overlapping first overlay target and second overlay target comprise a plurality of overlay blocks, wherein each overlay block comprises: a first interference pattern; a second interference pattern; and a pattern recognition feature; and measuring an offset of the first interference pattern relative to the second interference pattern for one or more of the plurality of overlay blocks.

Example 17: the method of Example 16, wherein a first overlay block is used to measure overlay in a first direction, and wherein a second overlay block is used to measure overlay in a second direction that is substantially orthogonal to the first direction.

Example 18: the method of Example 16 or Example 17, wherein the plurality of overlay blocks are arranged with 180° symmetry.

Example 19: the method of Examples 16-18, wherein the first interference pattern and the second interference pattern are moiré interference patterns.

Example 20: the method of Examples 16-19, wherein the first interference patterns are formed by the overlap of first gratings and third gratings, wherein the first gratings are transferred into the substrate and the third gratings are printed on the second photoresist layer, and wherein the second interference patterns are formed by the overlap of second gratings and fourth gratings, wherein the second gratings are transferred into the substrate and the fourth gratings are printed on the second photoresist layer.

Example 21: the method of Examples 16-20, wherein the first interference pattern provides a positive gain in the overlay and the second interference pattern provides a negative gain in the overlay.

Example 22: the method of Example 21, wherein the positive gain and the negative gain are between five times and 120 times.

Example 23: a semiconductor die, comprising: an overlay target, wherein the overlay target comprises: a pattern recognition feature; a first interference pattern; and a second interference pattern, wherein the pattern recognition feature, the first interference pattern, and the second interference pattern are laterally adjacent to each other.

Example 24: the semiconductor die of Example 23, further comprising: a package substrate electrically coupled to the semiconductor die; and a board electrically coupled to the package substrate.

Example 25: the semiconductor die of Example 23 or Example 24, further comprising a measurable offset between peaks of the first interference pattern relative to peaks of the second interference pattern.

What is claimed is:

1. A method of measuring overlay, comprising:
   printing a first pattern on a first resist layer over a substrate with a first reticle, wherein the first pattern comprises a first grating having a first pitch and a second grating having a second pitch, the second pitch different than the first pitch;
   transferring the first pattern into the substrate;
   printing a second pattern on a second resist layer over the substrate with a second reticle, wherein the second pattern comprises a third grating having a third pitch that is different than the first pitch and a fourth grating having a fourth pitch that is different than the second pitch, wherein the third grating overlaps the first grating to provide a first interference pattern and the fourth grating overlaps the second grating to provide a second interference pattern, and wherein the first pattern or the second pattern further comprises a pattern recognition feature; and
   measuring an overlay between the first pattern and the second pattern by comparing two or more of the first interference pattern, the second interference pattern, and the pattern recognition feature.

2. The method of claim 1, wherein the pattern recognition feature is adjacent to the first interference pattern, and wherein the first interference pattern is adjacent to the second interference pattern.

3. The method of claim 2, wherein comparing the first interference pattern to the second interference pattern comprises measuring a position of a first peak of the first interference pattern relative to a position of a second peak of the second interference pattern.

4. The method of claim 1, wherein the first interference pattern provides a positive gain in the overlay and the second interference pattern provides a negative gain in the overlay.

5. The method of claim 4, wherein the positive gain and the negative gain are between 5 times and 120 times.

6. The method of claim 1, wherein the first interference pattern and the second interference pattern are moiré interference patterns.

7. A method of measuring overlay, comprising:
   printing a first overlay target on a first photoresist over a substrate, the first overlay target comprising first gratings having a first pitch and second gratings having a second pitch, the second pitch different than the first pitch;
   transferring the first overlay target into the substrate;
   printing a second overlay target on a second photoresist over the substrate, wherein the second overlay target overlaps the first overlay target, wherein the overlapping first overlay target and second overlay target comprise a plurality of overlay blocks, wherein each overlay block comprises:
   a first interference pattern;
   a second interference pattern; and
   a pattern recognition feature; and
   measuring an offset of the first interference pattern relative to the second interference pattern for one or more of the plurality of overlay blocks.

8. The method of claim 7, wherein a first overlay block is used to measure overlay in a first direction, and wherein a second overlay block is used to measure overlay in a second direction that is substantially orthogonal to the first direction.

9. The method of claim 7, wherein the plurality of overlay blocks are arranged with 180° symmetry.

10. The method of claim 7, wherein the first interference pattern and the second interference pattern are moiré interference patterns.

11. The method of claim 7, wherein the first interference patterns are formed by the overlap of the first gratings and third gratings, wherein the first gratings are transferred into the substrate and the third gratings are printed on the second photoresist layer, and wherein the second interference patterns are formed by the overlap of the second gratings and fourth gratings, wherein the second gratings are transferred into the substrate and the fourth gratings are printed on the second photoresist layer.

12. The method of claim 7, wherein the first interference pattern provides a positive gain in the overlay and the second interference pattern provides a negative gain in the overlay.

13. The method of claim 12, wherein the positive gain and the negative gain are between five times and 120 times.

* * * * *